(12) United States Patent
Kim

(10) Patent No.: US 8,659,046 B2
(45) Date of Patent: Feb. 25, 2014

(54) LIGHT EMITTING DEVICE PACKAGE AND METHOD FOR FABRICATING THE SAME

(75) Inventor: Tae Yun Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 266 days.

(21) Appl. No.: 12/837,094

(22) Filed: Jul. 15, 2010

(65) Prior Publication Data

US 2011/0018021 A1 Jan. 27, 2011

(30) Foreign Application Priority Data

Jul. 24, 2009 (KR) ........................ 10-2009-0067782

(51) Int. Cl.
*H01L 33/00* (2010.01)
*H01L 33/48* (2010.01)

(52) U.S. Cl.
USPC ................ 257/99; 257/98; 257/190; 257/678

(58) Field of Classification Search
None
See application file for complete search history.

(56) References Cited

U.S. PATENT DOCUMENTS

| | | | | |
|---|---|---|---|---|
| 6,310,364 B1* | 10/2001 | Uemura | ........................ | 257/100 |
| 2007/0200131 A1* | 8/2007 | Kim | ................................ | 257/99 |
| 2007/0262328 A1* | 11/2007 | Bando | ............................. | 257/79 |
| 2010/0207156 A1* | 8/2010 | Cho | ................................ | 257/99 |
| 2010/0295089 A1* | 11/2010 | Kim et al. | ........................ | 257/99 |

FOREIGN PATENT DOCUMENTS

| | | |
|---|---|---|
| KR | 10-2006-0037638 A | 5/2006 |
| KR | 10-0813070 B1 | 3/2008 |
| KR | 10-2008-0041816 A | 5/2008 |

* cited by examiner

*Primary Examiner* — Johannes P Mondt
(74) *Attorney, Agent, or Firm* — McKenna Long & Aldridge, LLP

(57) ABSTRACT

Disclosed are a light emitting device package and a method for fabricating the same. The light emitting device package includes: a trench formed in a substrate; a light emitting structure which is directly grown on a first area of the trench in the substrate; an electrode on the substrate; a wire bonding connecting the electrode with the light emitting structure; and a filler filling the trench.

11 Claims, 3 Drawing Sheets

LIGHT EMITTING DEVICE PACKAGE AND METHOD FOR FABRICATING THE SAME

The present application claims priority under 35 U.S.C. §119 to Korean Patent Application No. 10-2009-0067782, filed on Jul. 24, 2009, the entirety of which is hereby incorporated by reference.

BACKGROUND

1. Field

This embodiment relates to a light emitting device and a method for fabricating the same.

2. Description of the Related Art

A light emitting device (LED) includes a p-n junction diode which converts electric energy into light energy. The p-n junction diode is manufactured by combining group 3 elements of the periodic table with group 5 elements of the periodic table. The LED can create various colors by adjusting a composition of a compound semiconductor.

When a forward voltage is applied, electrons of an p-layer and holes of a p-layer are coupled to each other, so that the p-n junction diode emits energy equivalent to the energy gap between a conduction band and a valance band. The energy is emitted in the form of heat or light. It is the LED that emits the energy in the form of light.

For example, since a nitride semiconductor has high thermal stability and wide band gap energy, more and more attention is paid to the nitride semiconductor in the field of developing an optical device and a high output electronic device. Particularly, a light emitting device such as a blue light emitting device, a green light emitting device and an UV light emitting device and the like which use the nitride semiconductor are commercialized and widely used.

Meanwhile, the following process is applied to a light emitting device package according to a conventional technology. A light emitting device is manufactured on a substrate. A light emitting device chip is separated from the light emitting device through die separation process that is a kind of a sawing process. Then, the light emitting device chip is die-bonded to the package body. Subsequently, a wire bonding process and a molding process are performed, and then a test process is performed.

However, as the conventional technology performs fabricating a light emitting device chip and packaging process separately, various complex processes and many substrates are required.

SUMMARY

One aspect of this invention is a light emitting device package. The light emitting device package includes: a trench formed in a substrate; a light emitting structure which is directly grown on a first area of the trench in the substrate; an electrode on the substrate; a wire bonding connecting the electrode with the light emitting structure; and a filler filling the trench.

Another aspect of this invention is a method for fabricating a light emitting device package. The method includes: forming a trench in a substrate; forming a light emitting structure on a first area of the trench; forming an electrode on the substrate; performing a wire bonding process between the electrode and the light emitting structure; and filling the trench with a filler.

BRIEF DESCRIPTION OF THE DRAWINGS

The embodiment will be described in detail with reference to the following drawings.

DETAILED DESCRIPTION OF EMBODIMENTS

In description of embodiments, when it is mentioned that each layer (film), an area, a pattern or structures are formed "on/over" or "under" a substrate, each layer (film), an area, a pad or a pattern, it means that the mention includes a case where each layer (film), an area, a pattern or structures are formed "directly" or "by interposing another layer (indirectly)". A criterion for "on/over" and "under" of each layer will be described based on the drawings.

A thickness or size of each layer is magnified, omitted or schematically shown for the purpose of convenience and clearness of description. The size of each component does not necessarily mean its actual size.

Embodiment

Figure 1:
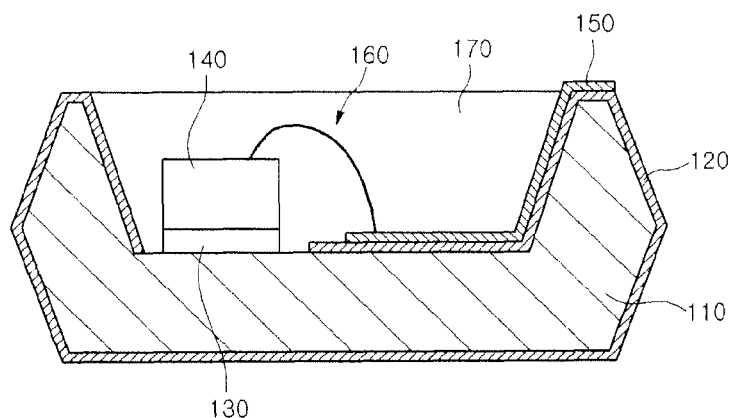
FIG. 1 is a cross sectional view of a light emitting device package according to an embodiment.

FIG. 1 is a cross sectional view of a light emitting device package according to an embodiment. FIGS. 2 to 9 are cross sectional views showing a method for fabricating a light emitting device package according to an embodiment. Hereinafter, a light emitting device is referred to as a LED.

In accordance with a LED package and a method for fabricating the same according to an embodiment, a separate chip process such as Fab process is not required because an LED Epi growth process, a chip process and a packaging process are performed on a substrate.

In conventional technology, Ag series material or epoxy series material are used so that an LED chip is die-bonded to the package body, while the embodiment of the present invention uses a homogeneous compound semiconductor. Therefore, it is possible to obtain high thermal conductivity and high electrical conductivity through the embodiment of the present invention.

In addition, the embodiment employs the current injection method which is the same as the current injection applied to a vertical chip. Therefore, it is possible to obtain excellent current spreading effect and high package efficiency.

Hereinafter, the method for fabricating a light emitting device package according to an embodiment will be described with reference to FIGS. 2 to 9. Hereinafter, a light emitting device is referred to as a LED.

Figure 2:
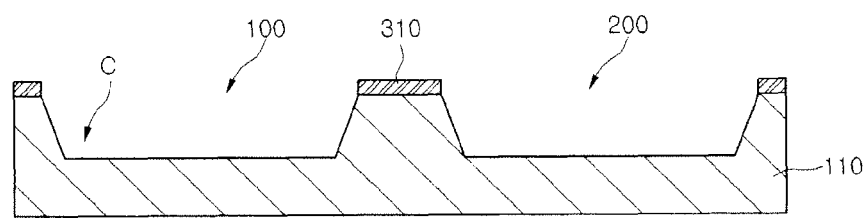
FIGS. 2 to 9 are cross sectional views showing a method for fabricating a light emitting device package according to an embodiment.

First, as shown in FIG. 2, a trench "C" is formed in a substrate 110. For example, a first pattern 310 is formed on the substrate 110, and the substrate 110 is etched by using the first pattern 310 as a mask, so that the trench "C" is formed. If the substrate 110 is a silicon substrate, the trench is formed to have a predetermined angle in accordance with the crystal orientation of the silicon substrate. However, the trench is not limited to this shape. The first pattern 310 may be formed not only on the substrate 110 but beneath the substrate 110.

A conductive substrate and a crystalline substrate and the like can be used as the substrate 110. For example, the substrate 110 includes a silicon substrate, GaN substrate, GaO substrate, a SiC substrate, a ZnO substrate and a GaAs substrate and the like. The substrate 110 is not limited to this kind of substrates.

Through the etching process, a first chip area 100 and a second chip area 200 may be formed. Hereinafter, the first chip area 100 will be mainly described. Here, the first chip area 100 and the second chip area 200 are not sawed from the substrate 100 until both of a chip process and a packaging process are completed. The first chip area 100 and the second chip area 200 can be sawed from the substrate 100 after the packaging process is completed.

Figure 3:
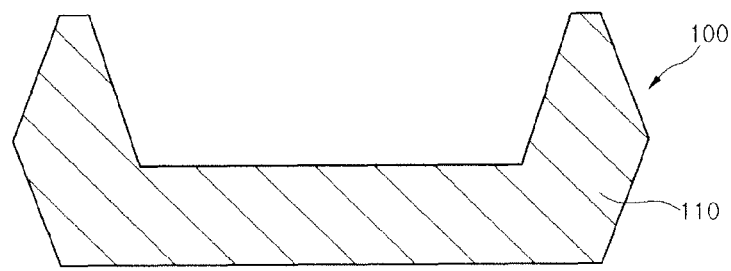

FIG. 3 is a view showing an enlarged first chip area 100. Here, as described above, according to the embodiment, FIG. 3 does not mean that the first chip area 100 is separated from the substrate 110. FIG. 3 merely shows the first chip area 100 conceptually.

Of course, when a through hole (not shown) is formed and a cross sectional view is shown on the basis of the through hole, a shape shown in FIG. 3 can be provided. Here, when a wet etching is performed depending on the crystal orientation of the substrate 110, the through hole is partially obliquely formed. However the shape of the through hole is not limited to this. The through hole can have a straight line shape in a vertical direction.

Figure 4:
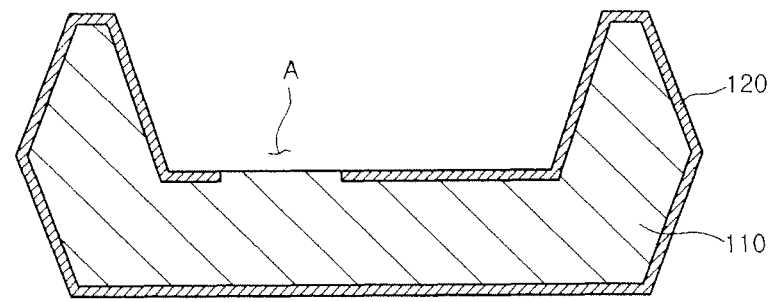

As shown in FIG. 4, an insulation layer 120 is formed on the surface of the substrate 110 except a first area "A" in the trench. For example, the insulation layer 120 may be formed by forming a second pattern (not shown) on the first area "A" and using $SiO_2$ film through thermal oxidation and the like. The method for forming the insulation layer 120 is not limited to this.

The insulation layer 120 functions as a mask growing an LED chip at a desired part, for example, an area of the substrate 100 in which the trench is formed.

Figure 5:
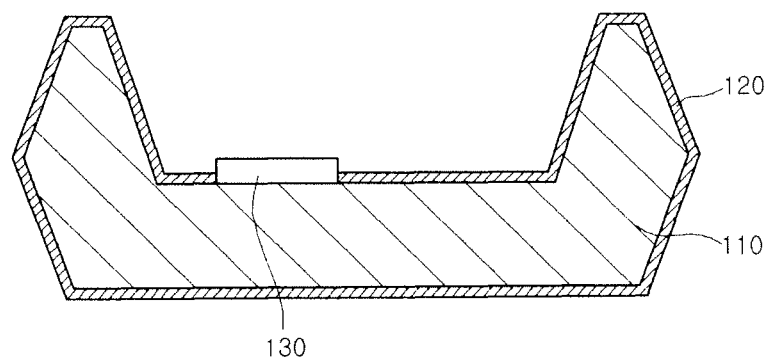

As shown in FIG. 5, the second pattern is removed and a buffer layer 130 is formed on the first area in the trench.

The buffer layer 130 is formed of silicon carbide (SiC) such that a crystal lattice of the substrate 110 matches with a crystal lattice of the a light emitting structure 140 to be formed later in order to prevent a crystal lattice defect caused by a crystal lattice difference between the substrate 110 and a light emitting structure 140. However, the material of the buffer layer 130 is not limited to this. For example, the buffer layer 130 may include AlN and ALGaN.

For example, the buffer layer 130 can be formed by using RF-CVD and the like at a high temperature. A method for forming the buffer layer 130 is not limited to this. After photoresist is applied on the insulation layer 120, the first area on which the buffer layer 130 is to be formed may be removed by a masking process and a solvent. Then, the buffer layer 130 is grown on the first area.

Meanwhile, when a SiC substrate is used as the substrate 110, the crystal lattice of the light emitting structure 140 may match with the crystal lattice of the substrate 110. Therefore, it is possible to produce the light emitting structure 140 without forming the buffer layer 130. In the embodiment, a first reflector metal layer (not shown) may be formed before the buffer layer 130 is formed. For example, in the embodiment, the first reflector metal layer may include Ti, Pa and the like. When the first reflector metal layer include such materials as Ti, Pa, and the like, the first reflector metal layer may not be oxidized during a subsequent process of forming the buffer layer 130.

Figure 6:
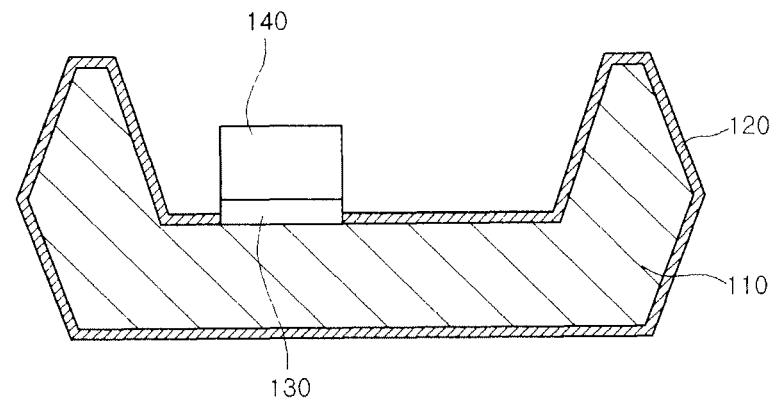

As shown in FIG. 6, a light emitting structure 140 is formed either on the substrate 110 of the first area or on the buffer layer 130. According to the embodiment, a separate pattern is not necessarily required to form the light emitting structure 140 because the Epi layer of the light emitting structure 140 is not grown on the insulation layer 120.

In a case where an existing LED chip is die-bonded to the package body, the embodiment of the present invention includes a method using a homogeneous compound semiconductor, while a conventional technology includes a method using Ag series material or epoxy series material. Therefore, it is possible to obtain high thermal conductivity and high electrical conductivity through the embodiment of the present invention.

Figure 7:
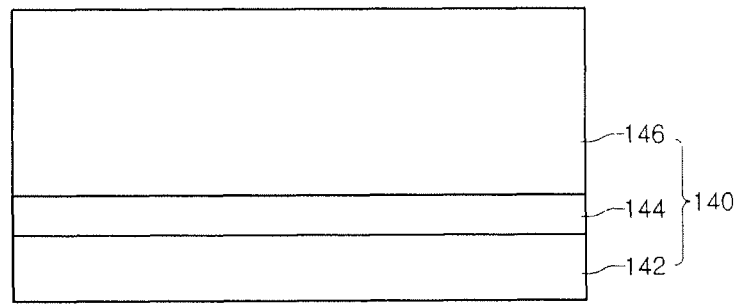

Additionally, it is possible to overcome the reliability problem caused by transformation or discoloration due to the thermal resistance of a die adhesive FIG. 7 is a view showing an enlarged light emitting structure 140.

In the embodiment, the light emitting structure is formed of GaN, GaAs, GaAsP, GaP and the like. For example, a green LED and a blue LED are formed of GaN of InGaN. A yellow LED and a red LED are formed of InGaAlP or AlGaAs. Based on a variety of material composition, full color can be also implemented.

The light emitting structure 140 includes a second conductive semiconductor layer 142, an active layer 144 and a first conductive semiconductor layer 146. The order of forming the light emitting structure 140 is not limited to the stacking order of FIG. 7.

A p-type GaN layer is formed as the second conductive semiconductor layer 142 by injecting ($EtCp_2Mg$) {Mg $(C_2H_5C_5H_4)_2$} including a p-type impurity such as TMGa gas, $NH_3$ gas, $N_2$ gas and Mg into a chamber. The second conductive semiconductor layer 142 is not limited to this.

The active layer 144 emits light having energy determined by a unique energy band of the active layer (i.e., a light emitting layer) when electrons injected through the first conductive semiconductor layer 146 meet the holes injected through the second conductive semiconductor layer 142. The active layer 144 may include a quantum well structure formed by stacking once or several times nitride semiconductor thin films having different energy bands. For example, the active layer 144 may include a multiple quantum well structure having a InGaN/GaN structure formed by injecting TMGa gas, $NH_3$ gas, $N_2$ gas and TMIn gas. The quantum well structure is not limited to this.

An n-type GaN layer may be formed as the first conductive semiconductor layer 146 by using a chemical vapor deposition (CVD), molecular beam epitaxy (MBE), a sputtering method or hydroxide vapor phase epitaxy (HVPE) and the like. Also, the first conductive semiconductor layer 146 may be formed by injecting $SiH_4$ gas including a n-type impurity such as TMGa gas, $NH_3$ gas, $N_2$ gas and Si into a chamber.

Figure 8:
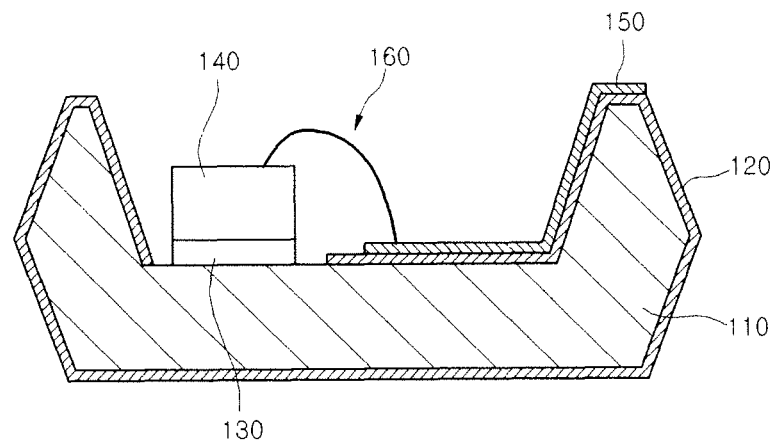

Next, as shown in FIG. 8, an electrode 150 may be formed on the substrate 110. For example, the electrode 150 may be formed on some areas of the insulation layer 120. The electrode 150 can be insulated from the substrate 110 due to the insulation layer 120 interposed therebetween.

In the embodiment, since the lower part of the light emitting structure 140 includes the electrically conductive buffer layer or the electrically conductive substrate which are made of an n-type or a p-type electrode, the upper part of the light emitting device may include a p-type or an n-type electrode having a polarity different from that of the lower of the light emitting device.

The electrode 150 may be formed of a material having excellent reflexibility and also functions as a reflective layer. Meanwhile, a second reflective layer (not shown) may be formed on the lateral surface of a trench having no electrode 150 formed thereon Then, the electrode 150 and the light emitting structure 140 may be coupled by a wire-bonding 160.

Figure 9:
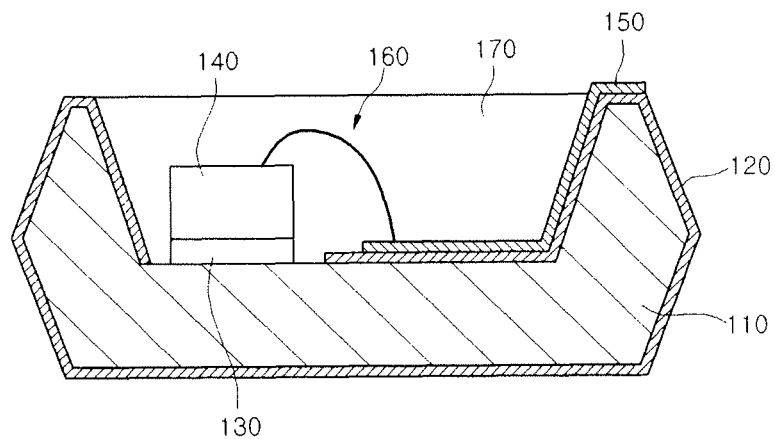

As shown in FIG. 9, the packaging process is completed by performing a molding process of filling the trench with filler 170. For example, the filler 170 includes epoxy resin and silicon resin and the like and is not limited to this.

In the embodiment, a molding process may be performed by using a fluorescent substance (not shown) so as to create a white light. For example, a yellow fluorescent substance such as YAG, TAG and the like may be added to a blue LED. For another example, red, green and blue three fluorescent substances are applied to an UV LED.

The LED package having LEDs formed therein may be sawed from the substrate based on each chip area and may be manufactured into a product through measurements and tests.

In accordance with a LED package and a method for fabricating the same according to an embodiment, a separate chip process such as Fab process is not required because an LED Epi growth process, a chip process and a packaging process are performed on a substrate.

In a case where an existing LED chip is die-bonded to the package body, the embodiment of the present invention includes a method using a homogeneous compound semiconductor, while a conventional technology includes a method using Ag series material or epoxy series material. Therefore, it is possible to obtain high thermal conductivity and high electrical conductivity through the embodiment of the present invention.

In addition, the embodiment employs the current injection method applied to a vertical chip. Therefore, it is possible to obtain excellent current spreading effect and high package efficiency.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A light emitting device package comprising:
    a cavity formed in a substrate, the substrate being a single body substrate;
    a buffer layer which is on and in contact with a portion of an upper main surface of the substrate within the cavity;
    growing a light emitting structure grown on the buffer layer in the cavity;
    an insulation layer on the substrate;
    an electrode on the insulation layer; and
    a wire bond connecting the electrode with the light emitting structure, wherein the buffer layer is conductive,
    wherein the buffer layer comprises a silicon carbide layer.

2. The light emitting device of claim 1 further comprising:
    a resin filler in the cavity.

3. The light emitting device of claim 1 further comprising:
    a fluorescent material in the cavity.

4. The light emitting device of claim 1, wherein the insulation layer is formed on a main surface of the substrate excluding where the light emitting structure is grown.

5. The light emitting device of claim 1, wherein the electrode comprises a reflective layer.

6. A method for fabricating a light emitting device package, the method comprising:
    forming a cavity in a substrate, the substrate being a single body substrate;
    forming a buffer layer on and in contact with a portion of an upper main surface of the substrate within the cavity;
    forming a light emitting structure on a portion of the buffer layer while the buffer layer is in the cavity;
    forming an insulation layer on the substrate;
    forming an electrode on the insulation layer; and
    wire-bonding the light emitting structure to the electrode, wherein the buffer layer is conductive,
    wherein the buffer layer comprises a silicon carbide layer.

7. The method of claim 6 further comprising:
    placing a resin filler in the cavity.

8. The method of claim 7 further comprising:
    placing a fluorescent material in the cavity.

9. The method of claim 6 further comprising:
    after forming the cavity, forming the insulation layer on a main surface of the substrate excluding where the light emitting structure is grown.

10. The method of claim 6, wherein forming the electrode on the substrate comprises:
    forming the electrode at least partially on the insulation layer.

11. The method of claim 6, wherein the electrode comprises a reflective layer.

* * * * *